United States Patent
Sakaiya et al.

(10) Patent No.: US 6,522,540 B2
(45) Date of Patent: Feb. 18, 2003

(54) DEVICE FOR RADIATING HEAT GENERATING ELECTRONIC PARTS, AN ELECTRONIC EQUIPMENT HAVING A HEAT RADIATING CONSTRUCTION, AND AN ELECTRONIC APPARATUS

(75) Inventors: Hiroyuki Sakaiya, Tokyo (JP); Kunihiko Kaga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/011,753

(22) Filed: Dec. 11, 2001

(65) Prior Publication Data

US 2002/0186533 A1 Dec. 12, 2002

(30) Foreign Application Priority Data

Jun. 12, 2001 (JP) .......................... 2001-176792

(51) Int. Cl.$^7$ ................................ H05K 7/20
(52) U.S. Cl. .................. 361/697; 361/689; 361/690; 361/694; 361/695; 174/16.1; 174/16.3; 165/80.3; 454/184
(58) Field of Search ................. 361/687–690, 361/694–697, 715, 719, 720, 721; 174/16.1, 16.3; 165/80.2, 80.3, 104.33, 185; 454/184

(56) References Cited

U.S. PATENT DOCUMENTS

| | | | | |
|---|---|---|---|---|
| 4,296,455 A | * | 10/1981 | Leycraft et al. | ............ 361/691 |
| 5,063,476 A | * | 11/1991 | Hamadah et al. | ............ 361/697 |
| 5,309,323 A | * | 5/1994 | Gray et al. | .................. 361/726 |
| 5,604,665 A | * | 2/1997 | Chrysler et al. | ............. 361/703 |
| 6,349,031 B1 | * | 2/2002 | Lin et al. | ...................... 361/685 |
| 6,349,042 B1 | * | 2/2002 | Mills et al. | .................. 361/818 |

OTHER PUBLICATIONS

U.S. patent application Ser. No. 10/011,755, filed Dec. 11, pending.
U.S. patent application Ser. No. 10/011,753, filed Dec. 11, pending.

* cited by examiner

Primary Examiner—Boris Chervinsky
(74) Attorney, Agent, or Firm—Oblon, Spivak, McClelland, Maier & Neustadt, P.C.

(57) ABSTRACT

An electronic apparatus containing in a rack a plurality of electronic equipments each having heat generating electronic parts, and provided with fins for dispersing heat from the electronic equipment, involves a problem of low heat radiating efficiency.

Providing a wind-path separation covers formed in a manner to cover top portions of the fins increases an amount of an air flowing into the fin-inbetween wind paths.

5 Claims, 11 Drawing Sheets

DEVICE FOR RADIATING HEAT GENERATING ELECTRONIC PARTS, AN ELECTRONIC EQUIPMENT HAVING A HEAT RADIATING CONSTRUCTION, AND AN ELECTRONIC APPARATUS

TECHNICAL FIELD

The invention relates to a device for radiating heat generating electronic parts, an electronic equipment having a heat radiating construction, and an electronic apparatus.

BACKGROUND ART

FIG. 12 is a plan view showing the construction of a conventional electronic equipment. In FIG. 12, the reference numeral 1 denotes a rack, 2 electronic equipments, 3 a fan, 4 electronic parts constituting heat sources, 5 fins for radiating heat from the electronic parts 4, 6 covers which cover the electronic parts 4, and 17 is an electronic apparatus comprising these elements. Also, FIG. 13 is a cross sectional view taken along the line A–A' of the electronic equipment 2. In FIG. 13, the reference numeral 7 denotes a chassis, 8 a package, 9 an inner casing, 10 fin-inbetween wind paths, and 11 a bypass wind path. In addition, in FIG. 13, the same reference numerals as those in FIG. 12 denote the same or corresponding parts, and so an explanation thereof is omitted.

An explanation will be given below to the constitution. As shown in FIG. 12, a plurality of electronic equipments 2 are arranged in the rack 1 such that the fins 5 and covers 6 face each other. Provided between adjacent electronic equipments 2 is a clearance (gap), which facilitates mounting of the electronic equipments 2 and work for maintenance and replacement. Mounted on these electronic equipments 2 are electronic parts 4, from which heat generates during action. The fins 5 are arranged in plural on a back surface of the chassis 7 (FIG.13), on which the electronic parts 4 are mounted. Conventionally, the fins 5 are formed integral with the chassis 7. Passages of an air flowing between adjacent fins 5 are the fin-inbetween wind paths 10. And the bypass wind path 11 is a passage of an air not flowing into the fin-inbetween wind paths 10. The bypass wind path 11 means a clearance between adjacent electronic equipments 2, that is, a passage of an air flowing between the fins 5 and the cover 6 of predetermined electronic equipments 2, and also means a passage of an air flowing between the fins 5 and inner walls of the rack 1. The rack 1 is provided with the fan 3, which supplies an air to an interior of the rack 1.

An explanation will be given below to the action. The electronic parts 4 mounted in the respective electronic equipments 2 generate heat during action. The electronic parts 4 reach a temperature of about 100 degrees, and 140 degrees or higher when high. Heat generated from the electronic parts 4 is transmitted to the package 8, inner casing 9, chassis 7, and the fins 5 shown in FIG. 13. Meanwhile, the fan 3 supplies an air to the interior of the rack 1 to create flows of wind passing through the fin-inbetween wind paths 10 and the bypass wind path 11. Heat transmitted to the fins 5, of heat generated from the electronic parts 4 is finally dispersed by wind flowing through the fin-inbetween wind paths 10. In this manner, since heat generated from the electronic parts 4 is mainly dispersed by wind flowing through the fin-inbetween wind paths 10, working of heat in the electronic parts 4 is suppressed.

Incidentally, with the electronic apparatus, the plurality of electronic equipments 2 are contained in the rack 1 with predetermined gaps between adjacent electronic equipments 2, as the result of taking account of workability in mounting, maintenance and replacement. In such electronic apparatus, a part of an air supplied from the fan 3 flows into the bypass wind path 11 and the remainder of the air flows into the fin-inbetween wind paths 10. Therefore, a fin-inbetween air volume is reduced by an air volume flowing into the bypass wind path 11, so that the cooling efficiency lowers. Since heat generated from the electronic parts 4 is mainly dispersed by wind flowing through the fin-inbetween wind paths 10, it is necessary to increase an output of the fan 3 to increase an air volume flowing into the fin-inbetween wind paths 10 so that a predetermined cooling efficiency is obtained by increasing an air volume flowing into the fin-inbetween wind paths 10.

If the fan 3 is increased in output, however, there is caused a problem that noise and vibrations generate in addition to an increase in power consumption of the fan 3. In order to increase an air volume flowing into the fin-inbetween wind paths 10 without any increase in output of the fan 3, it is necessary to relatively increase an air volume flowing into the bypass wind path. FIG. 14 is a graph of an air volume ratio of air volumes flowing through the fin-inbetween wind paths and the bypass wind path, and an illustrative view thereof. As shown in FIG. 14(a), a bypass air volume (B) flowing into the bypass wind path 11 accounts for about 35% of a total air volume a total air amount supplied from the fan 3. FIG. 14(b) shows a manner, in which an air flows into the fin-inbetween wind paths 10 and the bypass wind path 11. When a ratio, by which a bypass air volume accounts for the total air volume, is decreased, an air volume flowing through the fin-inbetween wind paths 10 can be increased without an increase in output of the fan 3.

BRIEF SUMMARY OF THE INVENTION

The invention has been accomplished to solve the above-mentioned problems and has its object to increase an air volume flowing into the fin-inbetween wind paths without any increase in output of the fan.

A device for radiating heat generating electronic parts, according to the invention comprises a fan provided in a rack containing a plurality of electronic equipments each having a chassis, on which a plurality of fins for dispersing heat generated from the heat generating electronic parts are arranged, and a cover covering the heat generating electronic parts, such that the fins and the cover face each other, the fan acting to supply an air into the rack; and wind-path separation covers formed in a manner to cover top portions of the fins and separating fin-inbetween wind paths, which are passages of an air flowing between the fins, and a bypass wind path, which is a passage of an air flowing between adjacent electronic equipments, from each other.

DETAILED DESCRIPTION OF THE INVENTION

Figure 1:
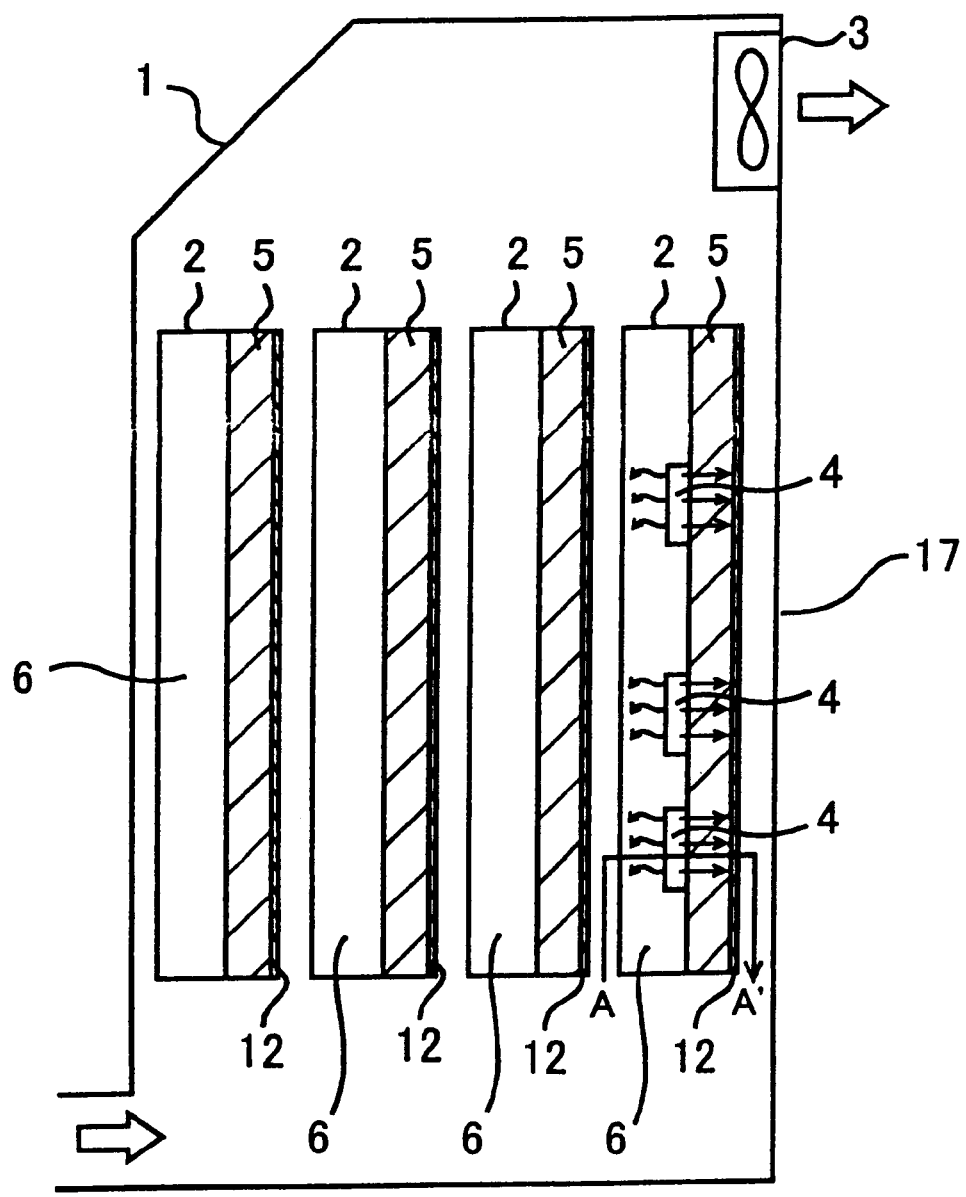
FIG. 1 is a plan view showing a construction of an electronic apparatus employing a radiating device for heat generating electronic parts, according to an embodiment of the invention.
Figure 2A:
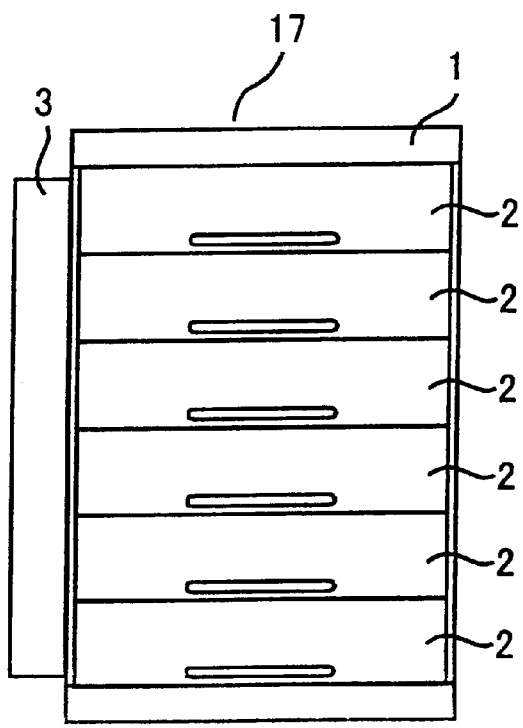
FIG. 2 is a front view showing an external appearance of a rack and a cross sectional view showing the same.
Figure 2B:
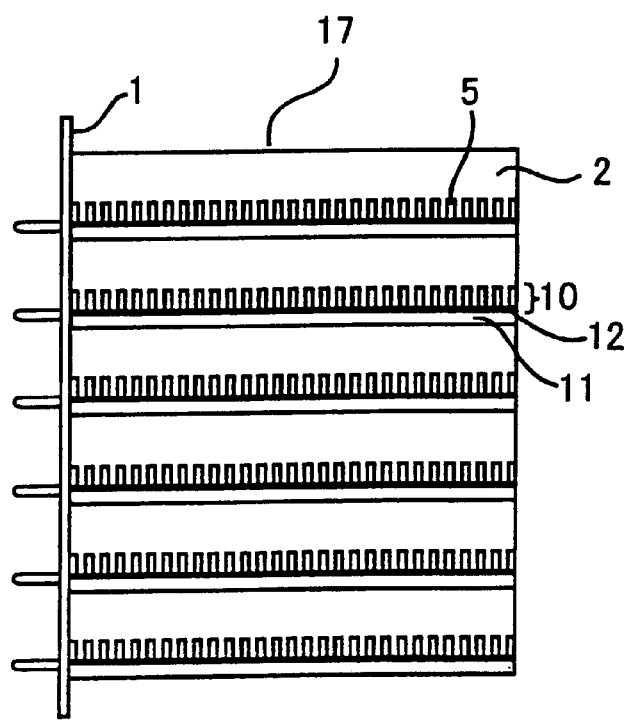
Figure 12:
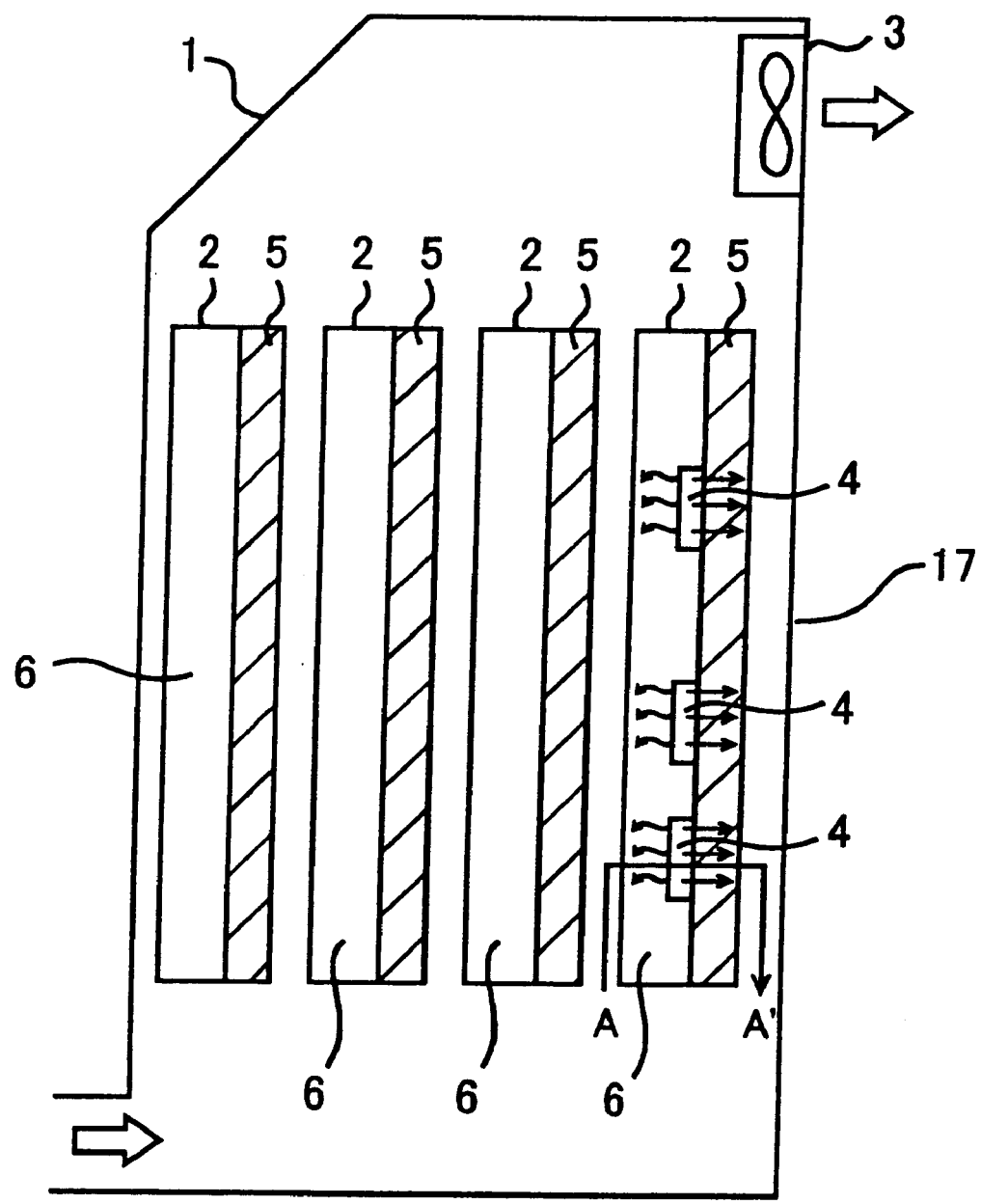
FIG. 12 is a plan view showing the construction of a conventional electronic equipment.
Figure 13:
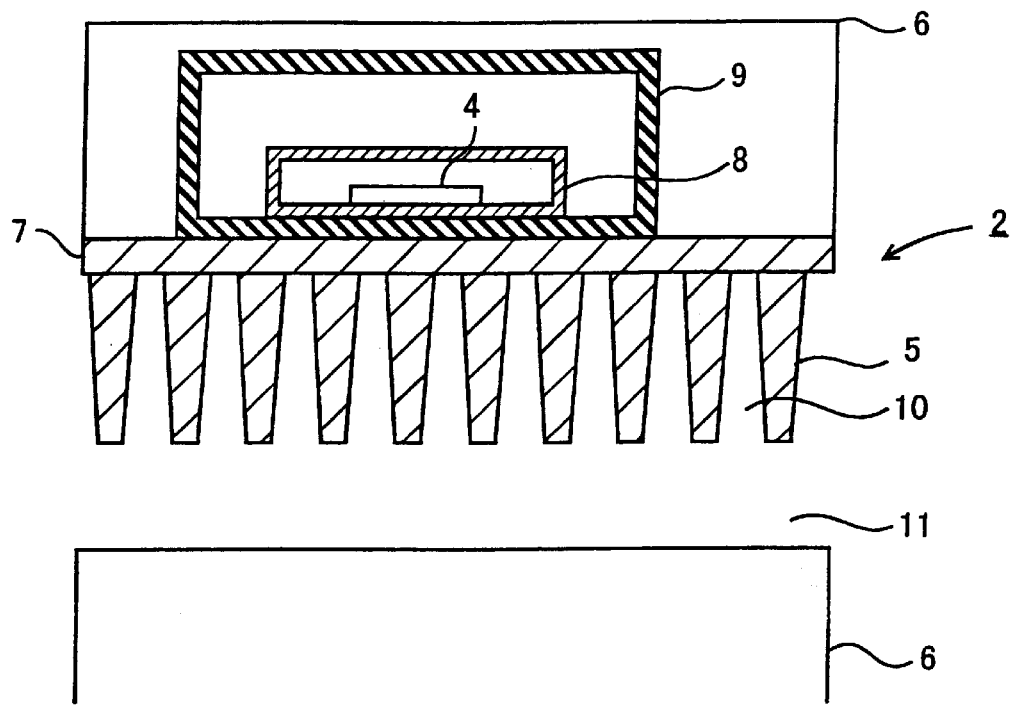
FIG. 13 is a cross sectional view taken along the line A–A' of the electronic equipment.

FIG. 1 is a plan view showing a construction of an electronic apparatus employing a radiating device for heat generating electronic parts, according to an embodiment of the invention. In FIG. 1, the reference numeral 12 denotes wind-path separation covers. In addition, the same reference numerals as those in FIG. 12 denote the same or corresponding parts, and so an explanation thereof is omitted. Electronic equipments 2 shown in FIG. 1 are provided with wind-path separation covers 12, which are formed to cover top portions of fins 5. FIG. 2 is a front view showing an external appearance of a rack and a cross sectional view showing the same. As shown in FIG. 2A, a plurality of electronic equipments 2 are vertically stacked and received in a rack 1. And, as shown in FIG. 2B, the fins 5 and covers 6 of the electronic equipments 2 are arranged to face each other, and fin-inbetween wind paths 10 and bypass wind paths 11 are separated from each other by the wind-path separation covers 12.

Figure 3A:
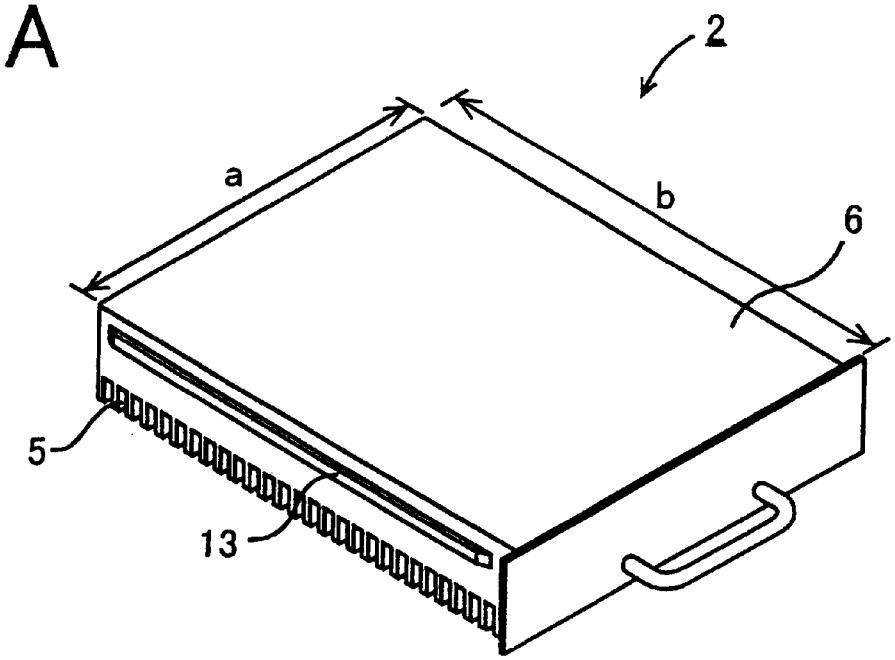
FIG. 3 is perspective views showing external appearances of an electronic equipment from sides of a cover and fins.
Figure 3B:
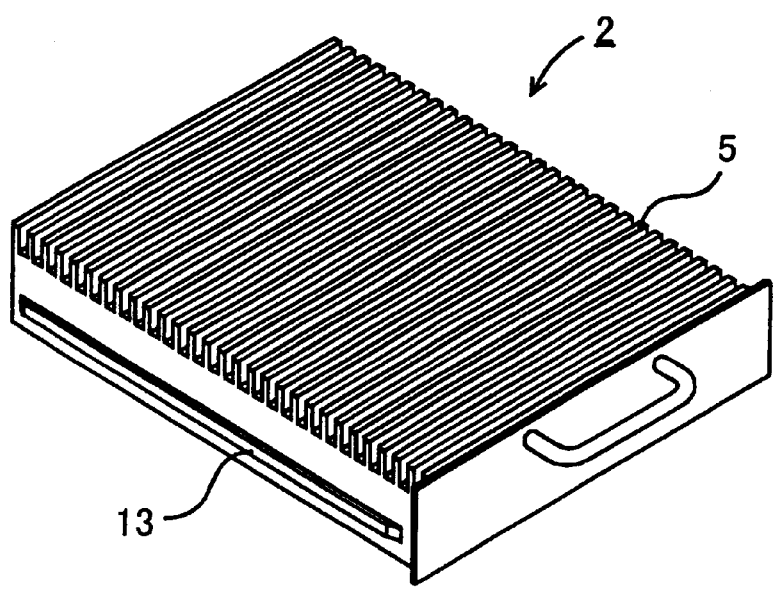
Figure 4A:
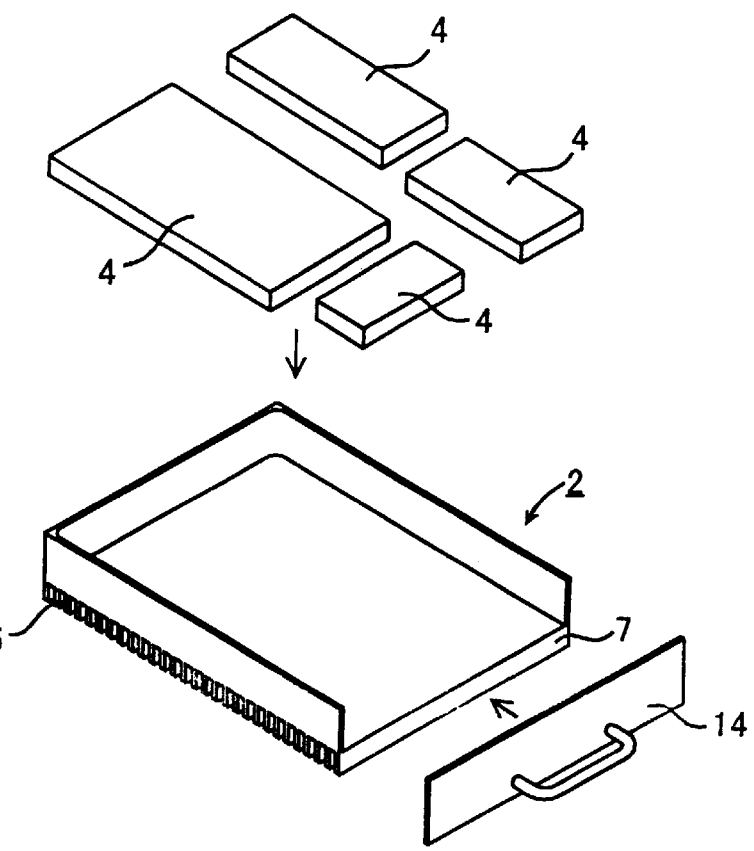
FIG. 4 is exploded, perspective views of the electronic equipment.
Figure 4B:
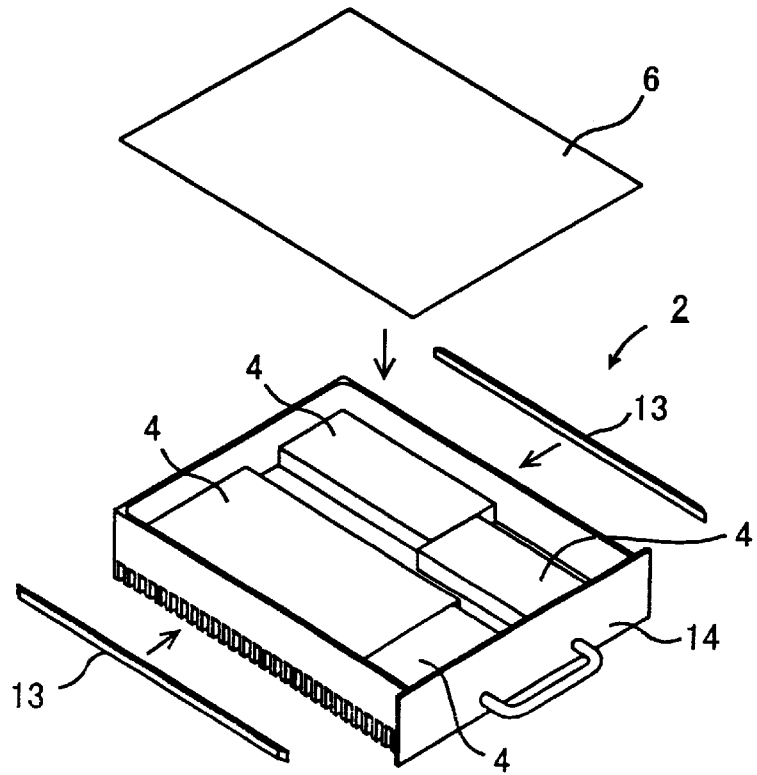
Figure 5:
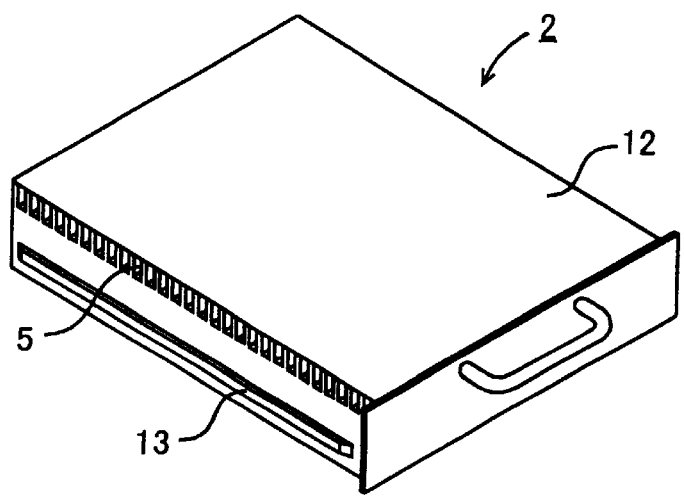
FIG. 5 is a perspective view showing an external appearance of the electronic equipment provided with a wind-path separation cover.

FIG. 3 is perspective views showing external appearances of an electronic equipment 2 from sides of a cover 6 (FIG. 3A) and fins 5(FIG. 3B), and shows the electronic equipment 2 provided without the wind-path separation cover 12. In FIG. 3, the reference numeral 13 denotes rails. The rack 1 holds the rails 13 of the electronic equipments 2 to receive the electronic equipments 2 therein. FIG. 4 is exploded, perspective views of the electronic equipment 2. In FIG. 4, the reference numeral 14 denotes a front panel. Although not shown in FIG. 4, the front panel 14 is generally provided with connectors, which connect to external equipments (not shown) electronic parts 4 mounted in the the electronic equipment 2. FIG. 4A shows a state, in which the electronic parts 4 are mounted on a chassis 7, with which the fins 5 are formed integral and to which the front panel 14 is mounted. FIG. 4B shows a state, in which the cover 6 and the rails 13 are mounted to the chassis. FIG. 5 is a perspective view showing an external appearance of an electronic equipment 2 provided with a wind-path separation cover 12. The electronic equipment 2 shown in FIG. 5 is provided with the wind-path separation cover 12, which covers an entire surface formed with the fins 5.

Figure 6:
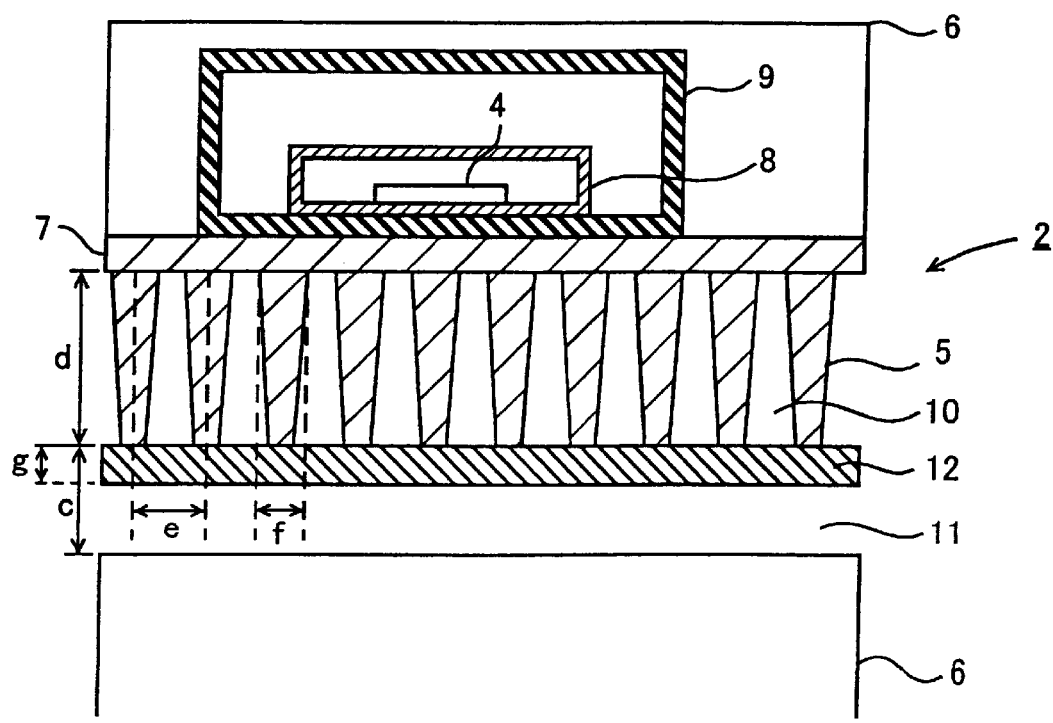
FIG. 6 is a cross sectional view of the electronic equipment taken along the line A–A'.

FIG. 6 is a cross sectional view of the electronic equipment taken along the line A–A'. An explanation will be given below to a radiating action of the electronic equipment 2 mainly with reference to FIG. 6. Electronic parts 4 mounted in the electronic equipment 2 generate heat in the course of action. Heat generated by the electronic parts 4 results in temperature of 100° C. to as high as 140° C. or higher. Temperature of the electronic parts 4 is transmitted to a package 8, an inner casing 9, the chassis 7 and the fins 5 shown in FIG. 6. Concretely, when an amount of heat generated by the electronic parts 4 amounts to 50 W and entails temperature of 120° C., the package 8 is at about 80° C., the inner casing 9 is at about 77° C., the chassis 7 is at about 70° C., and the fins 5 is at about 68° C. Incidentally, when an amount of heat generated by the electronic parts 4 amounts to 70 W and entails temperature of 140° C., the package 8 is at about 100° C., the inner casing 9 is at about 97° C., the chassis 7 is at about 90° C., and the fins 5 is at about 88° C.

Figure 7A:
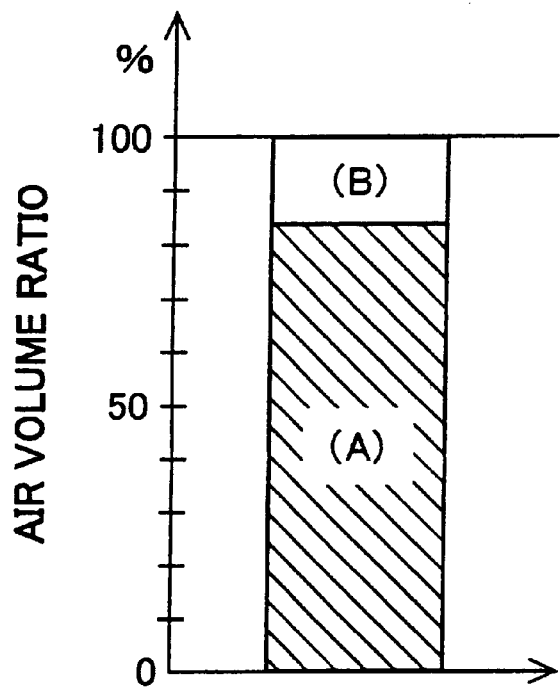
FIG. 7 is a graph showing an air volume ratio of air volumes flowing through fin-inbetween wind paths and a bypass wind path, and an illustrative view thereof.
Figure 7B:
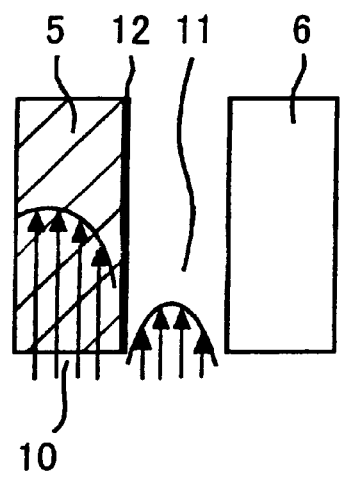
Figure 14A:
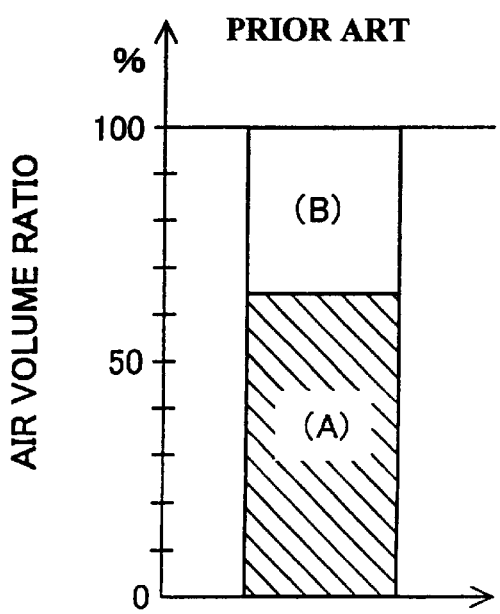
FIG. 14 is a graph of an air volume ratio of air volumes flowing through fin-inbetween wind paths and a bypass wind path, and an illustrative view thereof.
Figure 14B:
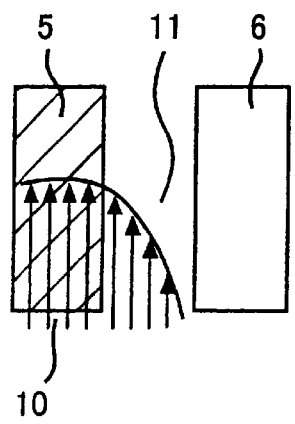

The fan 3 supplies an air into the rack 1 to thereby create a flow of an air passing through fin-inbetween wind paths 10 and bypass wind paths 11. The wind-path separation cover 12 causes wind created by the fan 3 to flow into the fin-inbetween wind paths 10 efficiently as compared with the case, in which such wind-path separation cover 12 is not present, thus dispersing heat of the fins 5 efficiently. Wind not flowing into the fin-inbetween wind paths 10 flows into the bypass wind path 11. FIG. 7 is a graph showing an air volume ratio of air volumes flowing through fin-inbetween wind paths and a bypass wind path in the case of provision of the wind-path separation cover, and an illustrative view thereof. In the case of provision of the wind-path separation cover 12, a bypass air volume(B) accounts for around 15% of a total air volume as shown in FIG. 7A. Meanwhile, in the case where the wind-path separation cover 12 is not provided, a bypass air volume accounts for around 35% of a total air volume as shown in FIG. 14. Thus it is found that the provision of the wind-path separation cover 12 causes more air to flow into the fin-inbetween wind paths with output of the fan constant.

Figure 8:
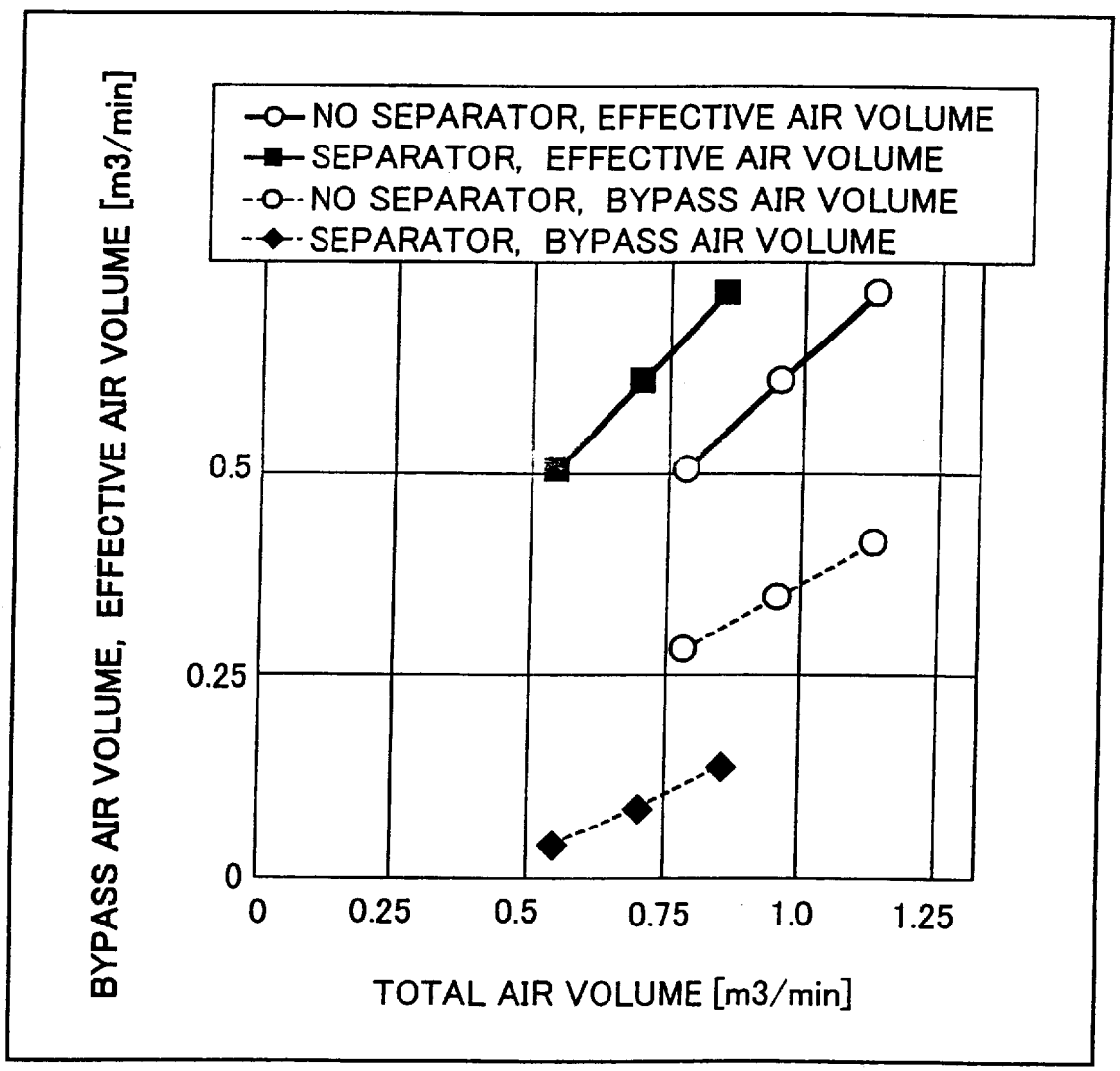
FIG. 8 is a graph showing actual measurement values of a bypass air volume and an effective air volume relative to a total air volume.

FIG. 8 is a graph showing actual measurement values of a bypass air volume and an effective air volume relative to a total air volume. In the graph shown in FIG. 8, the axis of ordinate indicates bypass air volume and the axis of abscissas indicates total air volume. In addition, "SEPARATOR" shown in FIG. 8 is the wind-path separation cover 12. Also, "effective air volume" means an amount of an air flowing through the fin-inbetween wind paths 10 to disperse heat of the fins 5. Dimensions of an electronic equipment 2 used in obtaining such experimental results are such that the width "b" against an air flow direction is 340 mm and the length "a" along the air flow direction is 300 mm as shown in FIG. 3A. Also, as shown in FIG. 6, the height "c" (a gap between the tops of the fins 5 and the cover 6) of the bypass wind path 11 is 3 mm, the height "d" of the fins 5 is 22 mm, the pitch "e" of the fins 5 is 5 mm, the average thickness "f" of the fins 5 is 1.7 mm, and the thickness "g" of the wind-path separation cover 12 is 0.5 mm.

It is revealed from the experimental results shown in FIG. 8 that a bypass air volume with, for example, a total air volume of 0.83 m³/min is reduced to 0.13 m³/min (provided with a wind-path separation cover) from 0.3 m³/min (provided with no wind-path separation cover) by providing the wind-path separation cover 12 on the fins 5 for separation of the fin-inbetween wind paths 10 and the bypass wind path 11. On the other hand, it is shown that a fin-inbetween air volume (effective air volume) contributing to cooling of the fins 5 increases around 30% to 0.7 m³/min from 0.53 m³/min. In this manner, the provision of a wind-path separation cover enables reducing a bypass air volume and increasing a fin-inbetween air volume even when a total air volume is constant. Accordingly, it is possible to efficiently cool the fins, which disperse heat generated by electronic parts.

Figure 9:
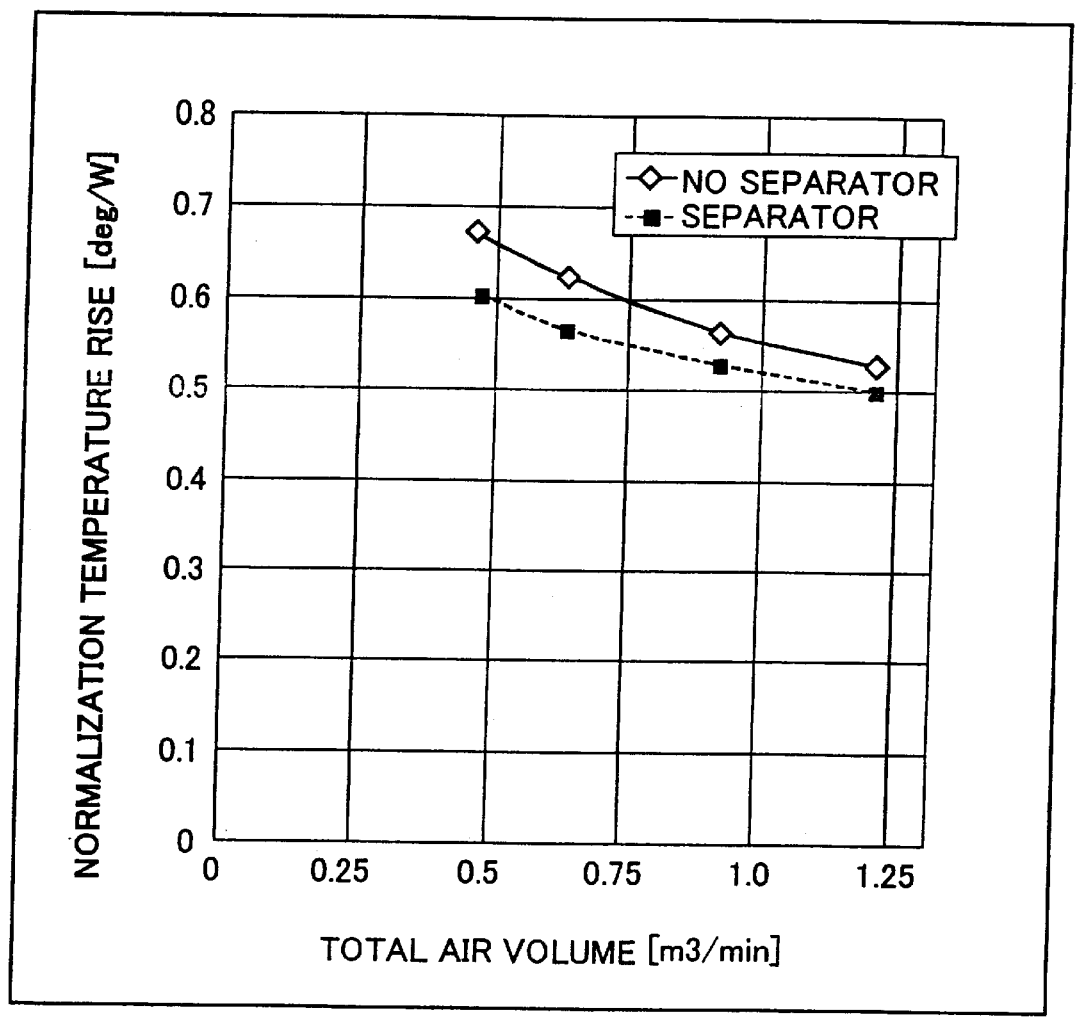
FIG. 9 is a graph showing the relationship between a total air volume and a chassis temperature.

FIG. 9 is a graph showing the relationship between a total air volume and a chassis temperature. In the graph shown in FIG. 9, the axis of ordinate indicates normalization temperature rise and the axis of abscissas indicates total air volume. In addition, "normalization temperature rise" means a value obtained by dividing a difference between temperature of a chassis immediately below an associated electronic part, which constitutes a heat source, and temperature of an air supplied by the fan, by a heating volume of the electronic part. The smaller such value, the higher a cooling capacity. According to the experimental results shown in FIG. 9, temperature rise with a total air volume being 0.83 m³/min is reduced about 0.05 deg/w by the providing of a wind-path separation cover. That is, it is found that the provision of a wind-path separation cover results in reduction in bypass air volume, an increase in fin-inbetween air volume and enhancement in cooling efficiency. Concretely, as the heating volume of an electronic part such as high-frequency oscillator devices or the like is about 50 to 100W, there is obtained an effect of lowering a temperature rise value by 2.5 to 5.0° C. The invention employs a wind-path separation cover to thereby be effective in the above-mentioned manner. In order to obtain the same effect by increasing the fan in output for an increase in total air volume, it is necessary to increase a total air volume by about 25%. It goes without saying that when a fan is enhanced in output so as to increase a total air volume by 25%, there are caused problems of an increase in power consumption of the fan as well as noise, vibrations or the like.

The reason why the provision of the wind-path separation cover 12 results in reduction in bypass air volume and an increase in fin-inbetween air volume while a total air volume is maintained constant is believed to be due to an increase in resistance (wind-path resistance) of the bypass wind path. Wind-path resistance is generally in proportion to a contact area (wet area) of an air flow and a wind speed. In the bypass wind path, an area of the cover 6 and top portions of the fins 5 facing each other is equal to a contact area of an air flow. More specifically, when the width of the top portions (of the fins) is 1 mm and the fin pitch (spacing of adjacent fins) is 5 mm, the sum of areas of the top portions of the fins 5 amounts only to one fifth of an area of the cover 6. Hereupon, when the wind-path separation cover 12 is provided, an area at the top portions of the fins 5 becomes equal to an area of the cover 6, and so a contact area of an air flow becomes approximately twofold. Accordingly, the bypass wind path becomes extremely great in wind-path resistance due to the provision of the wind-path separation cover. Meanwhile, turning to the fin-inbetween wind paths, a contact area of air flows passing through the fin-inbetween wind paths amounts to approximately nine times an area of the cover 6, taking account of surface areas of the fins. Accordingly, even when an area of the wind-path separation cover 12 is added, the contact area is increased only about 10%. That is, since the provision of the wind-path separation cover 12 leads to only about 10% of increase in wind-path resistance of the fin-inbetween wind paths though the bypass wind path becomes twofold in wind-path resistance, a bypass air volume becomes a half and a fin-inbetween air volume is correspondingly increased on the condition that a total air volume is the same.

As described above, the wind-path separation cover is provided to cause an increase in wind-path resistance of the bypass wind path, thereby enabling reduction in a bypass air volume flowing into the bypass wind path. Corresponding to reduction in a bypass air volume flowing into the bypass wind path, a fin-inbetween air volume flowing into the fin-inbetween wind paths is increased. Accordingly, it is possible with a predetermined fan output to efficiently radiate heat generated by electronic parts.

Figure 10:
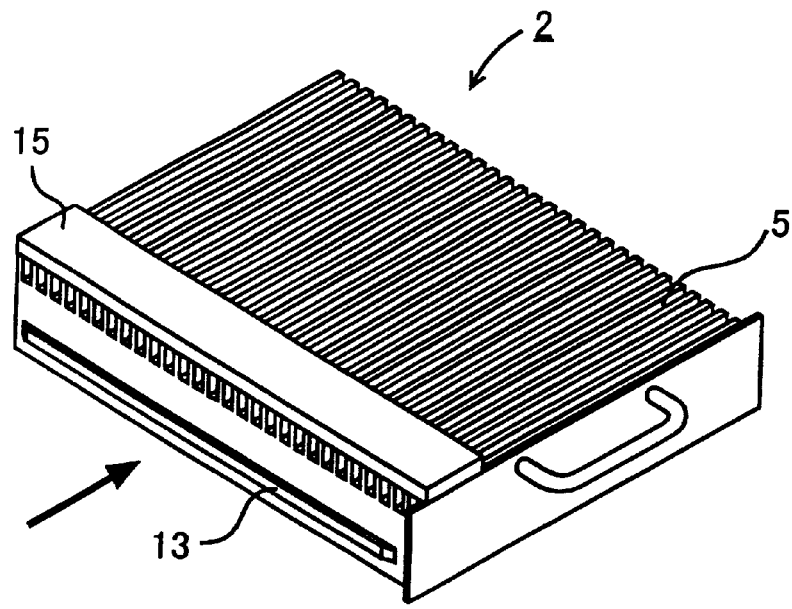
FIG. 10 is a perspective view showing an external appearance of an electronic equipment, in which a wind-path separation cover is provided on a part of fins.

The above-mentioned electronic equipment 2 is provided with the wind-path separation cover 12, which covers an entire surface, on which the fan 5 is formed. However, it is recognized that there is produced an effect of increasing an amount of an air flowing into the fin-inbetween wind paths when a wind-path separation cover is provided to cover only a portion of the surface, on which the fan 5 is formed. For example, FIG. 10 is a perspective view showing an external appearance of an electronic equipment, in which a wind-path separation cover is provided on a part of fins. In FIG. 10, the reference numeral 15 denotes a wind-path separation cover, and an arrow in the figure indicates a flow of an air flowing into the fin-inbetween wind paths. A side, from which an air flows into the fin-inbetween wind paths, is referred below to as "upstreams side" on the fins 5.

The electronic equipment 2 shown in FIG. 10 is provided only upstream of the fins 5 with the wind-path separation cover 15. The bypass wind path is increased in wind-path resistance by providing the wind-path separation cover 15 on an upstream side of the fins 5. However, the fin-inbetween wind paths are not so increased in wind-path resistance as the bypass wind path is. Accordingly, much of an air supplied by the fan flows into the fin-inbetween wind paths, which are relatively smaller in wind-path resistance than the bypass wind path is, rather than into the bypass wind path, which is much increased in wind-path resistance. In this manner, even if any wind-path separation cover covering the entire surfaces of the fins 5 were not provided, the provision of the wind-path separation cover only upstream of the fins 5 enables increasing the wind-path resistance of the bypass wind path to increase an amount of an air flowing through the fin-inbetween wind paths.

Figure 11:
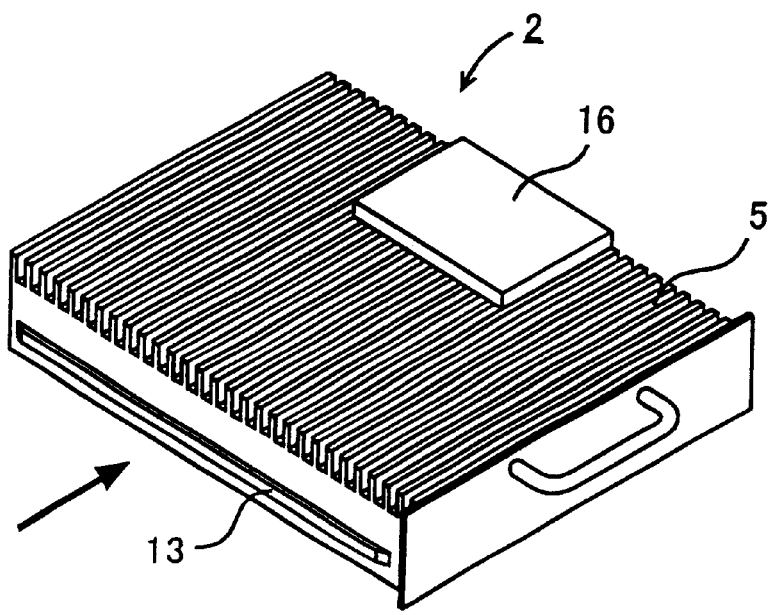
FIG. 11 is a perspective view showing an external appearance of an electronic equipment, in which a wind-path separation cover is provided on a part of fins.

Also, taking account of wind-path resistance of the bypass wind path corresponding to a position, at which the wind-path separation cover 15 is arranged, the provision of the wind-path separation cover makes it possible to increase an amount of an air flowing through the fin-inbetween wind paths in a desired position on the fins 5. FIG. 11 is a perspective view showing an external appearance of an electronic equipment, in which a wind-path separation cover is provided on a part of fins. In FIG. 11, the reference numeral 16 denotes a wind-path separation cover, and an arrow in the figure indicates a flow of an air flowing into the fin-inbetween wind paths. In addition, it is assumed that electronic parts constituting heat sources are mounted in a position, to which fins 5 provided with the wind-path separation cover 16 and a chassis correspond. The wind-path separation cover 16 is provided on the fins 5 corresponding to a position where the electronic parts constituting heat sources are mounted, whereby the bypass wind path is increased in wind-path resistance in a position where the wind-path separation cover 16 is arranged. However, the fin-inbetween wind paths are not so extremely increased in wind-path resistance as the bypass wind path is. Accordingly, much of an air supplied by the fan flows into the fin-inbetween wind paths, which are relatively smaller in wind-path resistance than the bypass wind path is, rather than into the bypass wind path, which is much increased in wind-path resistance. In this manner, the provision of the wind-path separation cover 16 on those fins 5, which correspond to a position where the electronic parts constituting heat sources are mounted, makes it possible to take much air into those fin-inbetween wind paths, which are closer to the heat sources, thus enabling concentratedly dispersing heat in a location near the heat sources.

As described above, a device for radiating heat generating electronic parts, according to the invention, comprises a fan provided in a rack containing a plurality of electronic equipments each having a chassis, on which a plurality of fins for dispersing heat generated from the heat generating electronic parts are arranged, and a cover covering the heat generating electronic parts, such that the fins and the cover face each other, the fan acting to supply an air into the rack, and wind-path separation covers formed in a manner to cover top portions of the fins and separating fin-inbetween wind paths, which are passages of an air flowing between the fins, and a bypass wind path, which is a passage of an air flowing between adjacent electronic equipments, from each other. Therefore, the bypass wind path is increased in wind-path resistance relative to the fin-inbetween wind paths to enable a large amount of an air to flow into the fin-inbetween wind paths.

Also, an electronic equipment having a heat radiating construction according to the invention mounts therein heat generating electronic parts generating heat upon actuation and causes heat generated by the heat generating electronic parts to be dispersed by an air supplied by a fan, the electronic equipment comprising a chassis formed on a side opposite to a surface, on which the heat generating electronic parts are mounted, and a plurality of fins for dispersing heat from the heat generating electronic parts and in which an air flowing between the fins radiates heat from the heat generating electronic parts, and a cover formed to cover top portions of the fins. Therefore, the bypass wind path is increased in wind-path resistance relative to the fin-inbetween wind paths to enable a large amount of an air to flow into the fin-inbetween wind paths, thus making it possible to enhance the heat radiating efficiency. Accordingly, overheat of the electronic parts can be suppressed by efficiently radiating heat from the electronic parts mounted in the electronic equipment.

Also, an electronic apparatus according to the invention comprises electronic equipments having a chassis, on which a plurality of fins for dispersing heat generated from heat generating electronic parts are arranged, and a cover, which covers the heat generating electronic parts, a rack containing a plurality of the electronic equipments such that the fins and the cover face each other, a fan provided on the rack to supply an air into the rack, and wind-path separation covers formed in a manner to cover top portions of the fins and separating fin-inbetween wind paths, which are passages of an air flowing between the fins, and a bypass wind path, which is a passage of an air flowing between adjacent electronic equipments, from each other. Therefore, the bypass wind path is increased in wind-path resistance relative to the fin-inbetween wind paths to enable a large amount of an air to flow into the fin-inbetween wind paths. Accordingly, the respective electronic equipments mounted in the electronic apparatus can be efficiently cooled to suppress overheat of the electronic equipments, thus improving reliability of the electronic apparatus.

What is claimed is:

1. A device for reducing heat generated by electronic components, comprising:

an air supply fan provided in a rack containing a plurality of electronic devices comprising heat generating electronic parts, each of said plurality of electronic devices configured to be enclosed in a chassis having a plurality of fins configured to disperse heat generated from the heat generating electronic parts and a cover covering the heat generating electronic parts, said plurality of electronic devices arranged in the rack such that a plurality of fins and a cover of a first electronic device face a plurality of fins and a cover of an adjacent electronic device; and a plurality of wind-path separation covers configured to cover a plurality of fin top portions and to separate at least one of a between-the-fins wind path and an equipment-to-adjacent-equipment bypass wind path.

2. The device according to claim 1, wherein the plurality of wind-path separation covers are formed on an upstream side of said plurality of fins.

3. The device according to claim 1, wherein the wind-path separation covers are formed on a portion of the plurality of fins mounted on an opposite side of a chassis wall on which the heat generating electronic parts are mounted.

4. An air-cooled electronic device in which heat generating electronic parts are mounted, comprising:

a chassis having a chassis equipment-mount side on which the heat generating electronic parts are mounted and a chassis fin-mount side on which a plurality of fins are mounted, said chassis equipment-mount side and said chassis fin-mount side being on opposing sides of a chassis wall; and a cover configured to cover a plurality of fin top portions, wherein said plurality of fins and said cover are configured to form at least one of a between-the-fins wind path and an equipment-to-adjacent-equipment bypass wind path.

5. An electronic apparatus comprising:

a rack comprising a plurality of electronic devices each comprising heat generating electronic parts and each enclosed in a chassis having a plurality of fins and a cover, said plurality of electronic devices arranged in said rack such that a plurality of fins and a cover of a first electronic device face a plurality of fins and a cover of an adjacent electronic device;

a fan configured to supply air into the rack; and a plurality of wind-path separation covers configured to cover a plurality of fin top portions and to separate at least one of a between-the-fins wind path and an equipment-to-adjacent-equipment bypass wind path.

* * * * *